(12) United States Patent
Hilali et al.

(10) Patent No.: US 8,633,374 B2
(45) Date of Patent: Jan. 21, 2014

(54) PHOTOVOLTAIC CELL COMPRISING CONTACT REGIONS DOPED THROUGH A LAMINA

(75) Inventors: Mohamed M. Hilali, Sunnyvale, CA (US); Christopher J. Petti, Mountain View, CA (US); S. Brad Herner, San Jose, CA (US)

(73) Assignee: GTAT Corporation, Nashua, NH (US)

( * ) Notice: Subject to any disclaimer, the term of this patent is extended or adjusted under 35 U.S.C. 154(b) by 868 days.

(21) Appl. No.: 12/339,038

(22) Filed: Dec. 18, 2008

(65) Prior Publication Data
US 2010/0154873 A1 Jun. 24, 2010

(51) Int. Cl.
*H01L 31/00* (2006.01)

(52) U.S. Cl.
USPC .......................................................... 136/255

(58) Field of Classification Search
CPC ... H01L 31/18; H01L 31/182; H01L 31/1804; H01L 31/1892; H01L 31/0288; H01L 31/0352; H01L 31/03921; H01L 31/0248; H01L 31/03125; H01L 31/0321; H01L 31/0325; H01L 31/0327; H01L 31/035263; H01L 31/0392
USPC ................................................. 136/243–265
See application file for complete search history.

(56) References Cited

U.S. PATENT DOCUMENTS

| | | | |
|---|---|---|---|
| 3,936,319 A * | 2/1976 | Anthony et al. | 136/255 |
| 3,994,012 A * | 11/1976 | Warner, Jr. | 136/246 |
| 4,173,496 A * | 11/1979 | Chiang et al. | 136/249 |
| 4,219,368 A * | 8/1980 | David | 136/249 |
| 4,379,202 A | 4/1983 | Chalmers | |
| 4,954,182 A * | 9/1990 | Ovshinsky et al. | 136/249 |
| 5,665,607 A * | 9/1997 | Kawama et al. | 438/64 |
| 5,985,742 A | 11/1999 | Henley et al. | |
| 6,048,411 A | 4/2000 | Henley et al. | |
| 6,146,979 A | 11/2000 | Henley et al. | |
| 6,281,428 B1 * | 8/2001 | Chiu et al. | 136/255 |
| 6,515,215 B1 * | 2/2003 | Mimura | 136/244 |
| 7,144,751 B2 * | 12/2006 | Gee et al. | 438/98 |
| 2004/0163699 A1 | 8/2004 | Boulanger | |
| 2005/0133082 A1 * | 6/2005 | Konold et al. | 136/246 |
| 2005/0145274 A1 * | 7/2005 | Polce et al. | 136/244 |
| 2005/0224108 A1 * | 10/2005 | Cheung | 136/251 |
| 2006/0205180 A1 | 9/2006 | Henley et al. | |
| 2007/0169808 A1 * | 7/2007 | Kherani et al. | 136/258 |

(Continued)

OTHER PUBLICATIONS

Merriam-Webster online dictionary definition for "Spot". Date accessed: Mar. 9, 2011.*

(Continued)

*Primary Examiner* — Eli Mekhlin
(74) *Attorney, Agent, or Firm* — The Mueller Law Office, P.C.

(57) ABSTRACT

In aspects of the present invention, a lamina is formed having opposing first and second surfaces. Heavily doped contact regions extend from the first surface to the second surface. Generally the lamina is formed by affixing a semiconductor donor body to a receiver element, then cleaving the lamina from the semiconductor donor body wherein the lamina remains affixed to the receiver element. In the present invention, the heavily doped contact regions are formed by doping the semiconductor donor body before cleaving of the lamina. A photovoltaic cell comprising the lamina is then fabricated. By forming the heavily doped contact regions before bonding to the receiver element and cleaving, post-bonding high-temperature steps can be avoided, which may be advantageous.

19 Claims, 9 Drawing Sheets

(56) References Cited

U.S. PATENT DOCUMENTS

2007/0277874 A1    12/2007    Dawson-Elli et al.
2008/0070340 A1    3/2008    Borrelli et al.
2008/0092944 A1*    4/2008    Rubin ............................ 136/252
2008/0188011 A1    8/2008    Henley

OTHER PUBLICATIONS

Cortés, P. Fernández-Martinez, D. Flores, S. Hidalgo, and J. Rebollo, "The thin SOI TGLDMOS transistor: a suitable power structure for low voltage applications," Semiconductor Science Technology, vol. 22, pp. 1183-1188.

J. Erdeljac, B. Todd, L. Hunter, K. Wagensohner, and W. Bucksch, "A 2.0 micron BiCMOS Process Including DMOS Transistors for Mergedlinear ASIC Analog/Digital/Power Applications," Conference Proceedings of the Seventh Annual Applied Power Electronics Conference and Exposition, Feb. 1992, pp. 517-522.

F.S. Becker, H. Treichel, and S. Röhl, "Low pressure deposition of doped SiO2 by pyrolysis of tetraorthosilicate (TEOS): II. Arsenic doped films," J. Electrochem. Soc. 136, 3303-3043 (1989).

M. Miyake, "Enhanced diffusion of boron in Si during doping from borosilicate glass," J. Electrochem. Soc. 145, 2534-2537 (1998).

E. Antoncik, "The influence of the solubility limit on diffusion of phosphorus and arsenic into silicon," Appl. Phys. A 58, 117-123 (1994).

U.S. Appl. No. 12/026,530, filed Feb. 5, 2008, entitled "Method to Form a Photovoltaic Cell Comprising Thin Lamina".

Notice of Allowance dated May 25, 2010 for U.S. Appl. No. 12/339,032.

* cited by examiner

Embodiment of 12/026530

Embodiment of 12/026530

Embodiment of 12/026530

Embodiment of 12/026530

PHOTOVOLTAIC CELL COMPRISING CONTACT REGIONS DOPED THROUGH A LAMINA

RELATED APPLICATIONS

This application is related to Hilali et al., U.S. patent application Ser. No. 12/339,032, "Method For Making a Photovoltaic Cell Comprising Contact Regions Doped Through a Lamina,", filed on even date herewith, owned by the assignee of the present application, and hereby incorporated by reference.

BACKGROUND OF THE INVENTION

The invention relates a lamina having heavily doped regions formed therethrough, where the lamina is used to form a photovoltaic cell. In the fabrication of photovoltaic cells, heavily doped regions are generally formed by diffusion doping, which is typically performed at relatively high temperature. For some fabrication techniques, it may be useful to minimize processing temperature during some stages of fabrication.

There is a need, therefore, for a method to form the structures of a photovoltaic cell while minimizing temperature.

SUMMARY OF THE PREFERRED EMBODIMENTS

The present invention is defined by the following claims, and nothing in this section should be taken as a limitation on those claims. In general, the invention is directed to a photovoltaic cell comprising a semiconductor lamina, the lamina including a heavily doped region extending from one surface of the lamina to the opposite surface, and methods of making such a structure.

A first aspect of the invention provides for a photovoltaic cell comprising: a semiconductor lamina lightly doped to a first conductivity type, the lamina having a first surface and a second surface opposite the first surface, wherein the lamina includes a plurality of discrete heavily doped contact regions, wherein each heavily doped contact region is doped above a first dopant concentration, and extends contiguously from the first surface to the second surface, and wherein the lamina comprises at least a portion of a base of the photovoltaic cell.

Each of the aspects and embodiments of the invention described herein can be used alone or in combination with one another.

The preferred aspects and embodiments will now be described with reference to the attached drawings.

DETAILED DESCRIPTION OF EMBODIMENTS

Figure 1:
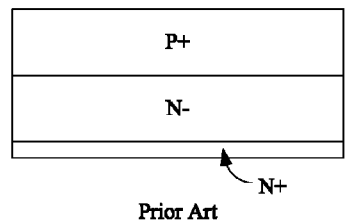
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons will knock electrons from the conduction band to the valence band, creating free electron-hole pairs. Within the electric field at the p-n junction, electrons tend to migrate toward the n region of the diode, while holes migrate toward the p region, resulting in current. This current can be called the photocurrent. Typically the dopant concentration of one region will be higher than that of the other, so the junction is either a p+/n− junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Conventional photovoltaic cells are formed from monocrystalline, polycrystalline, or multicrystalline silicon. A monocrystalline silicon wafer, of course, is formed of a single silicon crystal, while the term multicrystalline typically refers to semiconductor material having crystals that are on the order of a millimeter, or larger, in size. Polycrystalline semiconductor material has smaller grains, on the order of a thousand angstroms. Monocrystalline, multicrystalline, and polycrystalline material is typically entirely or almost entirely crystalline, with no or almost no amorphous matrix.

Photovoltaic cells fabricated from substantially crystalline material are conventionally formed of wafers sliced from a silicon ingot. Current technology does not allow wafers of less than about 150 microns thick to be fabricated into cells economically, and at this thickness a substantial amount of silicon is wasted in kerf, or cutting loss. Silicon solar cells need not be this thick to be effective or commercially useful. A large portion of the cost of conventional solar cells is the cost of silicon feedstock, so decreasing the thickness of a photovoltaic cell may reduce cost.

Figure 2A:
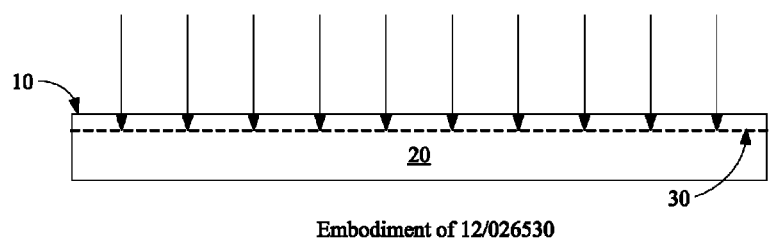
FIGS. 2a-2d are cross-sectional views illustrating stages in formation of an embodiment of Sivaram et al., U.S. patent application Ser. No. 12/026,530.
Figure 2B:
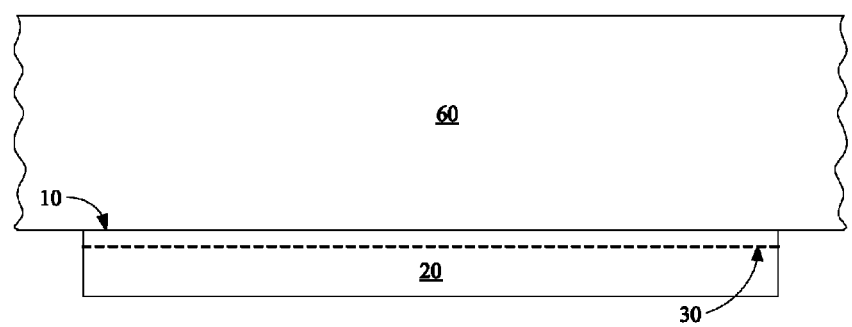
Figure 2C:
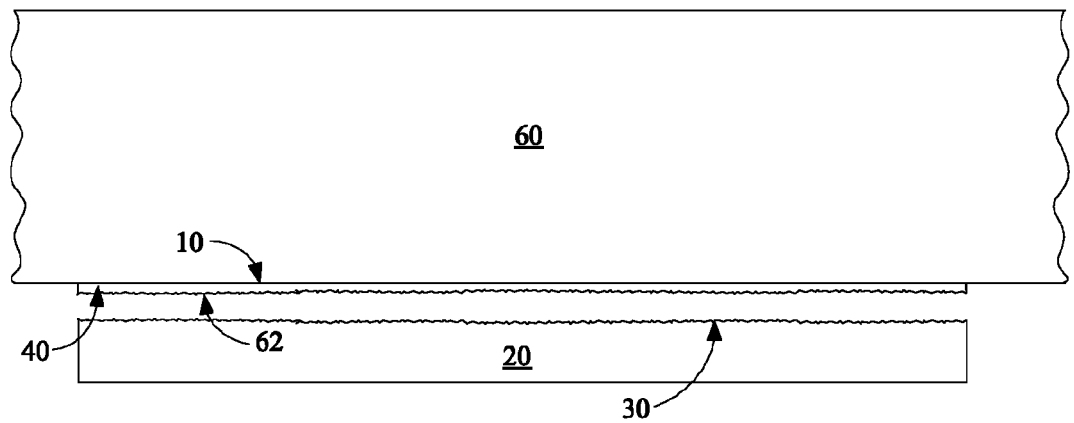
Figure 2D:
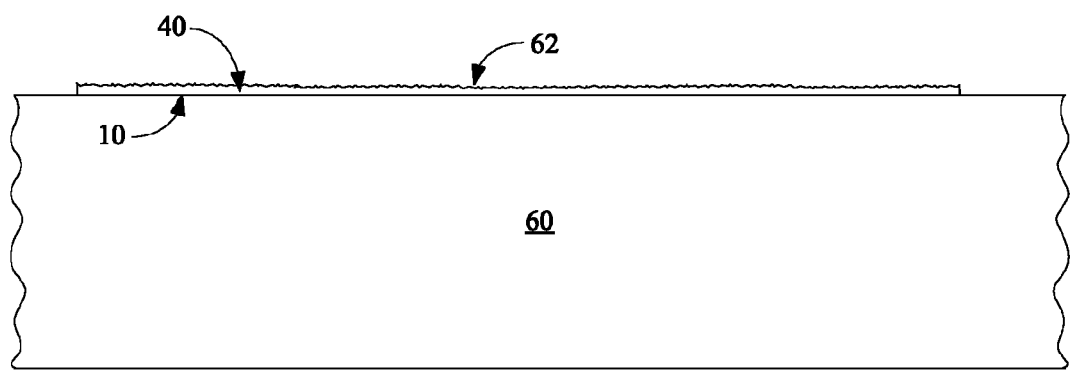

Sivaram et al., U.S. patent application Ser. No. 12/026,530, "Method to Form a Photovoltaic Cell Comprising a Thin Lamina," filed Feb. 5, 2008, owned by the assignee of the present application and hereby incorporated by reference, describes fabrication of a photovoltaic cell comprising a thin semiconductor lamina formed of crystalline, non-deposited semiconductor material. Referring to FIG. 2a, in embodiments of Sivaram et al., a semiconductor donor wafer 20 is implanted with one or more species of gas ions, for example hydrogen or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is less than 100 microns thick, generally between about 0.2 and about 100 microns thick, for example between about 0.2 and about 50 microns, for example between about 1 and about 50 microns thick, in some embodiments between about 1 and about 10 microns thick, though any thickness within the named ranges is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference.

Using the methods of Sivaram et al., photovoltaic cells are formed of thinner semiconductor laminae without wasting silicon through kerf loss or by formation of an unnecessarily thick wafer, thus reducing cost. The same donor wafer can be reused to form multiple laminae, further reducing cost, and may be resold after exfoliation of multiple laminae for some other use.

Conventional crystalline photovoltaic cells may be, for example, about 100 to 300 microns thick, and may have heavily doped regions formed on opposite faces of the wafer. Using conventional techniques, this cell structure is readily achieved: The wafer is doped as desired on both sides, then affixed to a substrate or superstrate once all high-temperatures steps are complete.

Referring to FIG. 2d, in many embodiments of Sivaram et al., heavily doped regions are also formed both at first surface 10 and at second surface 62 of the photovoltaic cell, in order to define a p-n junction and to provide ohmic contact to the cell. In embodiments of Sivaram et al. and Herner, the donor wafer is affixed to receiver element 60 before exfoliation so that receiver element 60 will provide mechanical support to thin lamina 40 during and after exfoliation. Lamina 40 may be very thin and will be prone to breakage during fabrication without this support. Doping of second surface 62, which is created by exfoliation, thus typically takes place while lamina 40 is bonded to receiver element 60. Formation of a heavily doped region at second surface 62 generally requires a high-temperature step to introduce and activate the dopant.

Exposing lamina 40 to a high-temperature step while it is bonded to receiver element 60 entails the risk of damage to receiver element 60; damage to the bond itself, of potential contamination to semiconductor lamina 40 by adjacent material, for example by metal or other conductive material at first surface 10; and of degradation of reflection quality in embodiments where a reflective layer is present between receiver element 60 and lamina 40. Careful selection of receiver and bonding materials may help reduce or eliminate this risk.

Figure 3A:
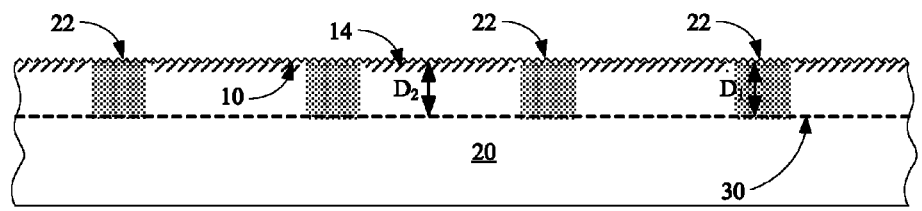
FIGS. 3a-3c are cross-sectional views illustrating stages in formation of a photovoltaic cell according to embodiments of the present invention.

In the present invention, such damage is avoided by avoiding high temperature steps after exfoliation. As noted, doping a portion of the semiconductor material with a conductivity-enhancing dopant is typically a high-temperature step. Referring to FIG. 3a, if doping is performed at first surface 10 of donor wafer 20 before cleave plane 30 is defined by implanting gas ions, and before bonding to a receiver element, there will be no risk that this doping step will damage the bond or contaminate the lamina to be formed. If, in the completed cell, electrical connection is to be made to the opposite, exfoliated surface, ohmic contact is improved if at least some portion of this surface is heavily doped. Thus in the present invention, heavily doped contact regions 22 are doped from first surface 10 before bonding to a receiver element.

In embodiments of the present invention, donor wafer 20 is lightly doped to a first conductivity type, either n-type or p-type. Heavily doped contact regions 22 of the first conductivity type are formed by doping at first surface 10. Heavily doped contact regions 22, in which dopant concentration exceeds a desired threshold, extend to a first depth $D_1$. Additionally, at least some portion of first surface 10 is heavily doped to a second conductivity type opposite the first, forming heavily doped junction region 14. As will be described, various methods may be used to avoid counter-doping each of these regions. Doping and activation of dopants in first heavily doped contact regions 22 and in heavily doped junction region 14 may be performed in the same thermal step or steps or in two or more separate thermal steps.

After doping, gas ions are implanted through first surface 10 to form cleave plane 30 at a second depth $D_2$ below first surface 10. The first depth $D_1$ of heavily doped contact regions 22 and the second depth $D_2$ of cleave plane 30 may be relatively close to each other, for example within about 0.5 microns of each other, for example within 0.1 micron of each other. Either $D_1$ or $D_2$ may be greater; heavily doped contact regions 22 may fall short of cleave plane 30, may reach cleave plane 30, or may extend beyond cleave plane 30.

Figure 3B:
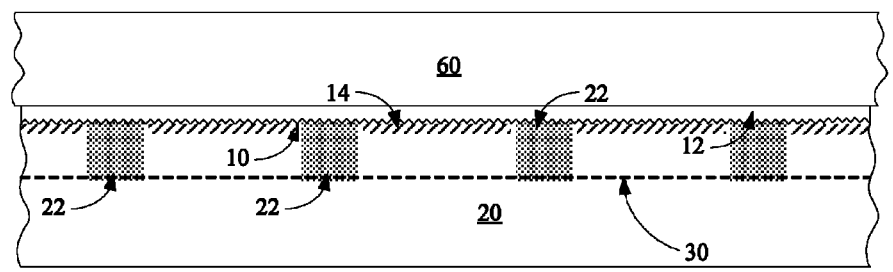
Figure 3C:
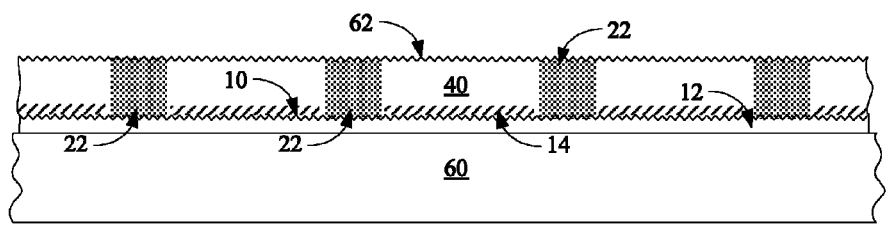

As shown in FIG. 3b, after any additional processing, donor wafer 20 is affixed to receiver element 60 at first surface 10. Conductive layer 12 may intervene between donor wafer 20 and receiver element 60 as may additional dielectric and/or conductive layers, not shown. Donor wafer 20 and receiver element 60 are bonded. As shown in FIG. 3c (which shows the structure inverted, with receiver element 60 at the bottom), a thermal step causes lamina 40 to cleave from donor wafer 20 at the cleave plane, creating second surface 62 of lamina 40.

Referring to FIGS. 3a-3c, recall that doped regions 22 were doped to a depth $D_1$ which was slightly less than, the same as, or greater than depth $D_2$ of cleave plane 30. Thus heavily doped contact regions 22 will be exposed, or nearly exposed, at second surface 62 in lamina 40 following its creation by cleaving at cleave plane 30. Contact regions 22 provide good ohmic contact at second surface 62 in the completed cell, avoiding the need for a high-temperature doping step following exfoliation.

If $D_1$, the depth of heavily doped contact regions 22, was greater than $D_2$, the depth of cleave plane 30 (both measured from first surface 10), heavily doped contact regions 22 will be exposed at second surface 62 immediately after the cleaving step; while if $D_1$ is less than $D_2$, heavily doped contact regions may not yet be exposed when second surface 62 is formed. Second surface 62 will undergo some additional treatment, including, for example, cleaning, texturing, etching to remove implant damage or for some other purpose, and/or deposition of additional layers. If heavily doped contact regions 22 are not exposed at second surface 62 immediately following exfoliation, a treatment of surface 62 will be performed to expose them. This treatment may be, for example, an etchback step. In some embodiments second surface 62 is textured; this texturing step may also serve to expose heavily doped contact regions 22. Heavily doped contact regions 22 may or may not be exposed at second surface 62 before treatment of this surface, but will be exposed after. Fabrication continues to complete the photovoltaic cell.

Summarizing, what has been described is a photovoltaic cell comprising: a semiconductor lamina lightly doped to a first conductivity type, the lamina having a first surface and a second surface opposite the first surface, wherein the lamina includes a plurality of discrete heavily doped contact regions, wherein each heavily doped contact region is doped above a first dopant concentration, and extends contiguously from the first surface to the second surface, and wherein the lamina comprises at least a portion of a base of the photovoltaic cell.

The cell was formed by a method comprising the steps of forming heavily doped contact regions in a donor wafer having a first surface, the heavily doped contact regions extending from the first surface into the donor wafer to a first depth from the first surface; defining a cleave plane in the donor wafer at a second depth from the first surface; affixing the donor wafer to a receiver element at the first surface; cleaving a lamina from the donor wafer at the cleave plane, wherein the lamina remains affixed to the receiver element, wherein the cleaving step creates a second surface of the lamina opposite the first surface; treating the second surface so that, after the treating step, the heavily doped contact regions are exposed at the second surface; and forming a photovoltaic cell comprising the semiconductor lamina.

For clarity, several examples of fabrication of a photovoltaic cell comprising a lamina, the lamina including heavily doped contact regions extending through the thickness of the lamina, from the first surface to the second surface, will be provided. For completeness, many materials, conditions, and steps will be described. It will be understood, however, that many of these details can be modified, augmented, or omitted while the results fall within the scope of the invention. In these embodiments, it is described to cleave a semiconductor lamina by implanting gas ions and exfoliating the lamina. Other methods of cleaving a lamina from a semiconductor wafer could also be employed in these embodiments.

EXAMPLE

Receiver Element as Substrate

The process begins with a donor body of an appropriate semiconductor material. An appropriate donor body may be a monocrystalline silicon wafer of any practical thickness, for example from about 300 to about 1000 microns thick. In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. The donor wafer is preferably at least 80 percent crystalline, and in general will be entirely crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 4A:
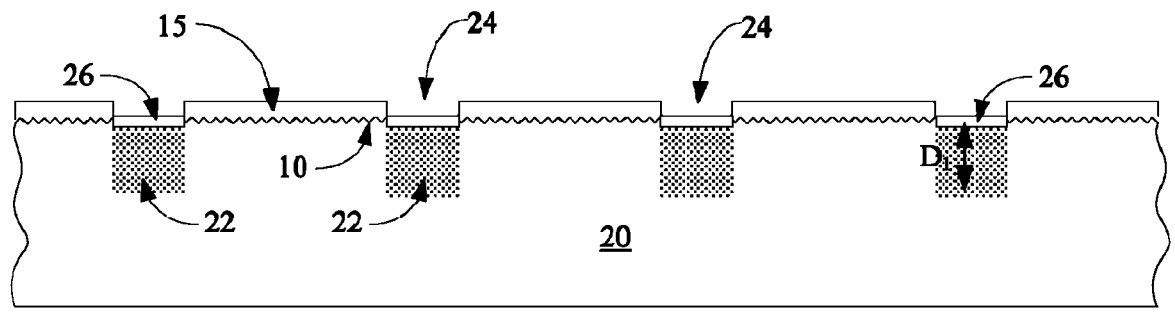
FIGS. 4a-4e are cross-sectional views illustrating stages in formation of a photovoltaic cell according to an embodiment of the present invention in which a receiver element serves as a substrate in the completed cell.

Referring to FIG. 4a, donor wafer 20 is formed of monocrystalline silicon which is lightly to moderately doped to a first conductivity type. The present example will describe a relatively lightly n-doped wafer 20 but it will be understood that in this and other embodiments the dopant types can be reversed. Dopant concentration may be between about $2\times10^{15}$ and $1\times10^{18}$ atoms/cm$^3$; for example between about $2\times10^{16}$ and $7\times10^{17}$ atoms/cm$^3$; for example about $5\times10^{17}$ atoms/cm$^3$. Desirable resistivity for n-type silicon may be, for example, between about 2 and about 0.02 ohm-cm, preferably about 0.3 to about 0.02 ohm-cm, for example about 0.05 ohm-cm. For p-type silicon, desirable resistivity may be between about 7 and about 0.04 ohm-cm, preferably between about 0.8 and about 0.06 ohm-cm, for example about 0.06 ohm-cm.

First surface 10 is optionally treated to produce surface roughness, for example, to produce a Lambertian surface. The ultimate thickness of the lamina limits the achievable roughness. In conventional silicon wafers for photovoltaic cells, surface roughness, measured peak-to-valley, is on the order of a micron. In embodiments of the present invention, the thickness of the lamina may be between about 0.2 and about 100 microns. Preferred thicknesses include between about 1 and about 80 microns; for example, between about 1 and about 20 microns or between about 2 and about 20 microns.

If the final thickness is about 2 microns, clearly surface roughness cannot be on the order of microns. For all thicknesses, a lower limit of surface roughness would be about 500 angstroms. An upper limit would be about a quarter of the lamina thickness. For a lamina 1 micron thick, surface roughness may be between about 600 angstroms and about 2500 angstroms. For a lamina having a thickness of about 10 microns, surface roughness will be less than about 25000 angstroms, for example between about 600 angstroms and 25000 angstroms.

Surface roughness may be random or may be periodic, as described in "Niggeman et al., "Trapping Light in Organic Plastic Solar Cells with Integrated Diffraction Gratings," Proceedings of the $1^{7th}$ European Photovoltaic Solar Energy Conference, Munich, Germany, 2001. Formation of surface roughness is described in further detail in Petti, U.S. patent application Ser. No. 12/130,241, "Asymmetric Surface Texturing For Use in a Photovoltaic Cell and Method of Making," filed May 30, 2008, owned by the assignee of the present application and hereby incorporated by reference.

In the present example, a diffusion barrier 15 is formed on first surface 10. Diffusion barrier 15 may be any appropriate material and thickness. In one embodiment, diffusion barrier 15 may be silicon nitride having a thickness of, for example, at least about 400 angstroms, for example about 750 or 800 angstroms. A suitable oxide, for example silicon dioxide, may be used, and may be somewhat thicker, in some embodiments about 2000 angstroms or more. Such an oxide may be deposited.

Next openings 24 are formed in diffusion barrier 15, for example by etching. Openings 24 may be in the form of stripes, isolated spots, or any other appropriate shape, at surface 10. A doping step is performed to form heavily doped contact regions 22. This doping may be performed by diffusion doping or by any other appropriate method. Diffusion doping typically is performed at relatively high temperature, for example 800 to 1000 degrees C. or more. In the present example heavily doped contact regions 22 are heavily doped to the same conductivity type as donor wafer 20, in this case n-type. Any appropriate n-type dopant, such as phosphorus or arsenic, may be used. Heavily doped contact regions 22 extend a first depth $D_1$ from first surface 10. Heavily doped contact regions 22 will generally be doped such that the concentration at or near depth $D_1$ from first surface 10 is at least $1\times10^{19}$ dopant atoms/cm³, for example about $3\times10^{20}$ atoms/cm³. Note that when donor wafer 20 is p-type, and therefore heavily doped contact regions 22 are p-type, a lower doping of heavily doped contact regions 22, for example as low as $3\times10^{18}$ atoms/cm³ at a depth $D_1$ from first surface 10, may be acceptable.

As will be understood by those skilled in the art, doping is not constant throughout each heavily doped contact region 22; concentration is highest at first surface 10, and drops off with depth. The shape of the doping profile depends on a variety of factors, including the dopant used. First depth $D_1$ is the depth at which doping concentration meets or exceeds the desired dopant level. In general there will also be some lower degree of doping beyond depth $D_1$.

As will be appreciated by those skilled in the art, the spacing of openings 24, and thus of heavily doped contact regions 22, will be selected according to characteristics of the cell, including the expected current to be produced by the cell, the material and technology used to form wiring, the thickness of the lamina to be formed, and resistivity of donor wafer 20; as will be seen, this resistivity will define the resistivity of the base region of the completed cell. When base resistivity is lower, heavily doped contact regions 22 can be farther apart; when base resistivity is higher, heavily doped contact regions 22 must be closer together. The center-to-center distance or pitch of openings 24, and thus between heavily doped contact regions 22, may vary widely, for example, between about 200 and about 3000 microns. Assuming the lamina to be formed will have a thickness between about 2 and about 5 microns, if the resistivity of donor wafer 20 is relatively low, for example about 0.05 ohm-cm, the pitch of heavily doped contact regions 22 may be between about 1000 and about 3000 microns, for example about 1200, 1500, or 2000 microns. For the same finished lamina thickness, if the resistivity of donor wafer 20 is relatively high, for example about 2 ohm-cm, the pitch of heavily doped contact regions 22 will be much tighter, for example between about 200 and about 800 microns, for example between about 600 and 700 microns. Pitch may further be adjusted based on the shape of openings 24; if openings 24 are stripes, for example, they may be more widely spaced than if they are isolated spots. It will be understood that the values provided here are examples only.

Note that during this doping step, dopant will diffuse laterally as well as perpendicularly from first surface 10; for simplicity this lateral diffusion has not been depicted in the drawings. Drawings are not to scale, and in general have been exaggerated vertically for better visibility of features. In most embodiments the thickness of lamina 40, often between about 1 and about 10 microns, is very small relative to the distance between heavily doped contact regions 22.

If heavily doped contact regions 22 are formed by diffusion doping, a region 26 of doped glass will remain at the surface 10 of each heavily doped contact region 22 after doping. For example, if the dopant is phosphorus, doped glass regions 26 will be of phosphosilicate glass (PSG).

The width of gaps 24 will likely be selected, in part, based on the method used to form them, and, as will be described, on the method used to form the wires that will connect to them. If the width of gaps 24 is defined by screen printing, gaps 24 will typically be about 70 microns wide or wider, for example about 100, 115, or 120 microns or more. To define features by screen printing, etchant paste is printed and baked. If gaps 24 are defined by laser, they can be significantly narrower, for example about 15, 25, 50 microns wide or wider. In one embodiment, gaps 24 are stripes having a width no more than about 120 microns. In another embodiment, gaps 24 are isolated spots, each having a longest surface dimension no more than about 120 microns.

Figure 4B:
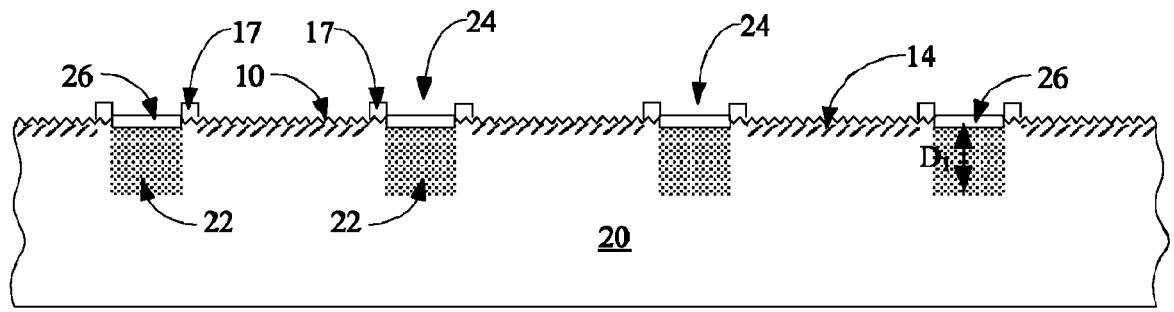

Next, turning to FIG. 4b, diffusion barrier layer 15 is almost entirely removed, preferably leaving boundary spacer regions 17 at the edges of gaps 24. This selective removal of diffusion barrier layer 15 is performed by any appropriate method, for example by screen printing. If gaps 24 are stripes at first surface 10, boundary spacer regions 17 will be in the form of narrow stripes paralleling gaps 24. If gaps 24 are isolated spots at first surface 10, each boundary spacer region 17 will be formed around the periphery of a gap 24. The width of boundary spacer region 17 may be, for example, from about 15 to about 200 microns. In general when the lamina 40 is higher resistivity, boundary spacer regions 17 will have a width between about 15 and about 100 microns, while when lamina 40 is lower resistivity, boundary spacer regions 17 will have a width no more than about 150 or 200 microns.

Figure 4C:
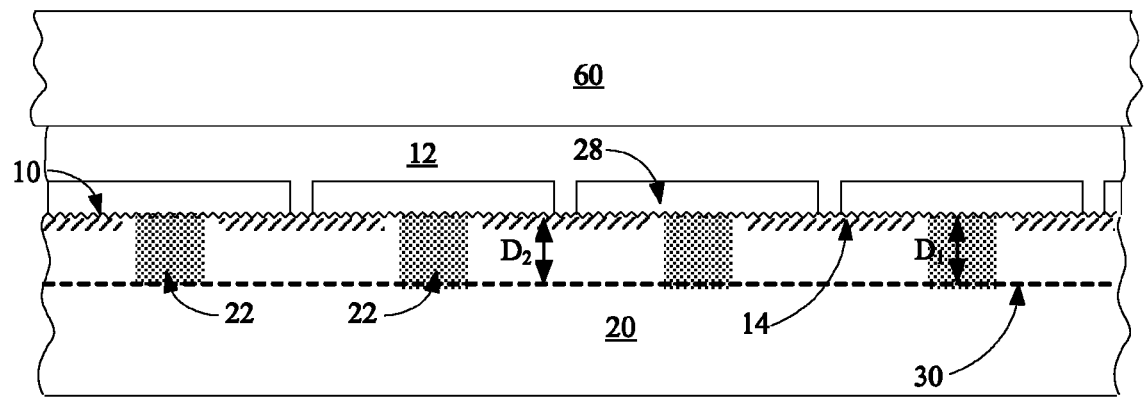

Exposed portions of first surface 10 will be heavily doped to a second conductivity type opposite the first; in this example first surface 10 is doped with a p-type dopant, for example boron or aluminum. This doping step may be performed by any appropriate method, for example by diffusion doping. The regions 26 of PSG prevent counterdoping of heavily doped contact regions 22 during this doping step. Dopant concentration may be, for example, between about $1\times10^{18}$ and $1\times10^{21}$ atoms/cm³, for example about $1.5\times10^{20}$ atoms/cm³. Heavily doped p-type junction region (or regions) 14 is formed at first surface 10. A p+/n− junction exists between heavily doped junction region 14 and the rest of lightly doped n-type donor wafer 20. If heavily doped junction region 14 was formed by diffusion doping with boron, a layer (not shown) of borosilicate glass (BSG) remains at first surface 10 after doping. Turning to FIG. 4c, this layer of BSG and regions 26 of PSG are removed, for example by etching, along with boundary spacer regions 17. Note that the presence of boundary spacer regions 17 during the diffusion doping step to form heavily doped junction region 14 will prevent direct contact between n-type heavily doped contact regions 22 and p-type heavily doped junction region 14, such that these regions are electrically isolated from each other in the completed device.

Diffusion doping to form heavily doped junction region 14 is a thermal step, which may cause depth $D_1$ of heavily doped contact regions 22 to increase. For simplicity no such increase is depicted in the figures.

In the next step, ions, preferably hydrogen or a combination of hydrogen and helium, are implanted to define a cleave plane 30, as described earlier. The depth $D_2$ of cleave plane 30 from first surface 10 is determined by several factors, including implant energy. Cleave plane depth $D_2$ and the depth $D_1$ of heavily doped contact regions 22 may be relatively close to each other, for example within about 0.5 micron of each other, or in some embodiments within about 0.1 micron of each other. Depth $D_1$ of heavily doped contact regions 22 may be greater than depth $D_2$ of cleave plane, may be the same, or may be less. Cleave plane 30 can be between about 0.2 and about 10 microns, for example between about 0.5 and about 6 microns, for example between about 1 and about 5 microns.

Once the implant has been performed, exfoliation will occur once certain conditions, for example elevated temperature, are encountered. It is necessary, then, to keep processing temperature and duration below those which will initiate exfoliation until exfoliation is intended to take place. The cost of the hydrogen or helium implant may be kept low by methods described in Parrill et al., U.S. patent application Ser. No. 12/122,108, "Ion Implanter for Photovoltaic Cell Fabrication," owned by the assignee of the present application, filed May 16, 2008, and hereby incorporated by reference.

A dielectric layer 28 is deposited on first surface 10. This layer can be, for example, an insulating oxide, nitride, or a stack including both; for example a stack may include a thinner oxide and a thicker nitride. Silicon nitride, which will further serve to passivate first surface 10, may be an advantageous choice. Layer 28 may have any appropriate thickness, for example about 700 to about 800 angstroms, for example 750 angstroms. Silicon dioxide may be used as well, and will likely be thicker, for example about 1000 to about 2000 angstroms. This relatively thick dielectric layer 28 will tend to enhance the reflectivity of conductive layer 12.

Openings are formed in dielectric layer 28 by any appropriate method, for example screen printing or laser. These openings should expose heavily doped junction region 14 at first surface 10. A conductive layer 12 is formed on dielectric layer 28. Conductive layer 12 will make electrical contact to heavily doped junction region 14 in the openings. Note that conductive layer 12 should not make electrical contact to heavily doped contact regions 22. In the present embodiment conductive layer 12 is a reflective material as well. Any suitable conductive, reflective material, such as a metal or metal alloy, may be used for conductive layer 12, for example silver, aluminum, copper, titanium, etc. Other alternatives for such a layer, in this and other embodiments, include chromium, molybdenum, tantalum, zirconium, vanadium, indium, cobalt, antimony, or tungsten, or alloys thereof In other embodiments, conductive layer 12 could comprise a stack of two or more of these materials or alloys.

Still referring to FIG. 4c, donor wafer 20 is bonded to receiver element 60, in this embodiment with conductive layer 12 and dielectric layer 28 interposed between them. Bonding may be achieved by any appropriate methods, including those discussed in Herner et al., U.S. patent application Ser. No. 12/057,274, "A Photovoltaic Assembly Including a Conductive Layer Between a Semiconductor Lamina and a Receiver Element," filed Mar. 27, 2008; and in Agarwal et al., U.S. patent application Ser. No. "Methods of Transferring a Lamina to a Receiver Element," Ser. No. 12/335,479, filed Dec. 15, 2008, both owned by the assignee of the present invention and hereby incorporated by reference. If aluminum is selected for conductive layer 12 and receiver element 60 is a material that contains one or more alkali or alkali earth metals, such as soda-lime glass or Pyrex, anodic bonding may be advantageous.

Receiver element 60 can be any suitable material, including glass, metal, a polymer, or a semiconductor material, for example metallurgical grade silicon. In most embodiments, receiver element 60 has a widest dimension no more than about twenty percent greater than the widest dimension of the lamina. For example, the widest dimension of the lamina may be no more than about 30 cm.

Figure 4D:
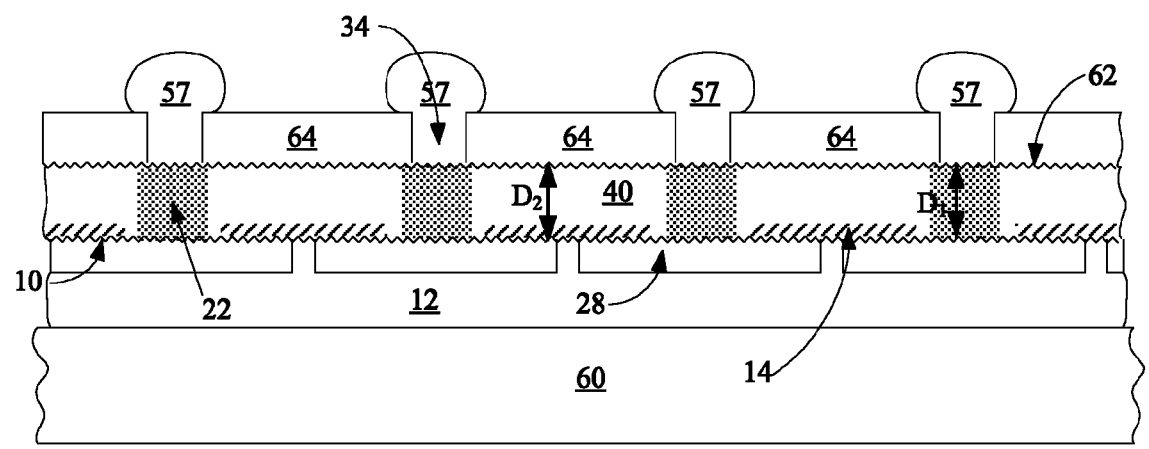

Referring to FIG. 4d, which shows the structure inverted with receiver element 60 on the bottom, a thermal step causes lamina 40 to cleave from donor wafer 20 at the cleave plane. In some embodiments, this cleaving step may be combined with a thermal bonding step. Cleaving is achieved in this example by exfoliation, which may be achieved at temperatures between, for example, about 350 and about 650 degrees C. In general exfoliation proceeds more rapidly at higher temperature. Exfoliation temperatures below 600 degrees C., for example between about 450 and 550 degrees C., may reduce unwanted diffusion of metals into lamina 40, and thus may be advantageous.

Second surface 62 has been created by exfoliation. If the depth $D_1$ of heavily doped contact regions 22 was the same as or greater than cleave plane depth $D_2$, heavily doped contact regions 22 will be exposed at second surface 62 immediately following the cleaving step. If heavily doped contact region depth $D_1$ was less than cleave plane depth $D_2$, heavily doped contact regions 22 will be near second surface 62 but not yet exposed.

As has been described, some surface roughness is desirable to increase light trapping within lamina 40 and improve conversion efficiency of the photovoltaic cell. The exfoliation process itself creates some surface roughness at second surface 62. In some embodiments, this roughness may alone be sufficient. In other embodiments, surface roughness of second surface 62 may be modified or increased by some other known process, such as a wet or dry etch, or by the methods described by Petti, as may have been used to roughen first surface 10.

The implant step used to create the cleave plane will produce some damage to the crystalline structure of the lamina. This damage will be most extensive at the end of the range of implanted ions. This damaged area will thus be at or near second surface 62. This damaged area could cause excessive recombination of photogenerated carriers, as well as forming a layer that is difficult to electrically contact with a low enough resistance. Alternatively, the damaged layer could be etched off, for example, in a solution of $HF:H_2C_3O_2:HNO_3$ in a ratio of 2:5:15 for about 3-5 sec. Such an etching step would remove about 0.25 microns of silicon, which should contain all of the damaged material for a typical cleaving implant. Other possible etches include a TMAH etch, which will remove about 0.2 microns of silicon in about 1.5 to about 2 minutes; or, alternatively, a hydroxide or potassium hydroxide etch.

These etch or other steps, including cleaning, anneal, plasma treatment, or a wet chemical etch will be performed at second surface 62. If heavily doped contact regions 22 were not exposed at second surface 62 immediately after exfoliation, this treatment will serve to expose them. This treatment may be performed specifically in order to expose heavily doped contact regions 22, or these regions may be exposed during an etch step or other step performed for some other purpose. In any case, heavily doped contact regions 22 are exposed at second surface 62 after second surface 62 has been treated.

Note that if $D_1$, the depth of heavily doped contact regions 22, is greater than $D_2$, the depth of the cleave plane, portions of the surface of the donor wafer will be doped following exfoliation. If this donor wafer is used again to form another lamina, or for some other purpose, a thickness of this donor wafer may need to be removed, for example by etchback, to remove the remaining doped regions. Alternatively, if the donor wafer is to be used to form another lamina which is to have heavily doped contact regions of the same conductivity type, size, shape, and distribution as the previous one, the doped regions in the next lamina may simply be aligned with the existing ones.

Lamina 40 is between about 0.2 and about 10 microns thick, in most embodiments between about 0.5 and about 6 microns thick, for example between about 1 and about 5 microns thick. The lateral diffusion of the heavily doped contact regions 22 will be about the same as the vertical diffusion, which will be on the order of the lamina thickness. For most embodiments the thickness of lamina 40 is very small relative to the distance between heavily doped contact regions 22 at first surface 10. Thus the size and shape of heavily doped contact regions 22 exposed at second surface 62 will be nearly the same as the size and shape of these same regions at first surface 10.

One or more dielectric layers are formed on second surface 62. For example, a layer 64 of silicon nitride having an appropriate thickness, for example between about 500 and about 2000 angstroms, is formed on second surface 62. Silicon nitride layer 64 will serve as an antireflective coating (ARC) and may be about 650 angstroms thick. Other appropriate ARCs may be used instead.

Openings 34 are created in layer 64 exposing at least portions of heavily doped contact regions 22 at second surface 62. The size and shape of an opening 34 may be about the same as the area of the corresponding heavily doped contact region 22 which it exposes, or may be somewhat smaller to facilitate alignment and minimize carrier recombination at the metal interface. Openings 34 may be created by various methods, including screen printing or laser ablation; thus the width of these openings may range from about 15, 20, 25, or 50 microns to about 75, 80, 100, 110 microns or more.

Next wiring 57 is formed in openings 34. Wiring 57 can be formed by a variety of methods. When openings 34 and wiring 57 are to be relatively narrow, for example less than 75 microns, wiring may advantageously be formed by electroless plating. For example, in one embodiment, formation of a very thin nickel seed layer (not shown) on the exposed regions of second surface 62 is followed by electroplating of copper, or, for example, conventional or light-induced plating of either silver or copper. These plating methods selectively deposit the metal, forming wiring 57. The thickness of wiring 57 will be selected to produce the desired resistance, and may be, for example, about 7 to 10 microns. In other embodiments, wiring 57 may be formed by other methods, for example screen printing, or, alternatively, aerosol-jet printing or inkjet printing. Note that heavily doped contact regions 22 will provide improved passivation of wiring 57.

Many variations are possible. For example, as described in Hilali et al., U.S. patent application Ser. No. 12/189,157, "Photovoltaic Cell Comprising a Thin Lamina Having Low Base Resistivity and Method of Making," filed Aug. 10, 2008, owned by the assignee of the present application and hereby incorporated by reference, if heavily doped contact regions 22 are in the form of stripes, electrical contact may be made to these stripes by forming openings 34 in silicon nitride layer 64, where openings 34 are in the form of a series of holes aligned along a heavily doped stripe 22. If openings 34 are relatively small, electrical contact may be made to heavily doped contact regions 22 at second surface 62 by forming plugs within openings 34 by electroless or light-induced plating. The plugs will be larger above the surface of silicon nitride layer 64, and may contact each other, forming a continuous wire 57 parallel to the heavily doped stripe below.

The processing steps described here are only one possibility, and may be varied in many respects. For example, referring to FIG. 4a, in an alternative embodiment, diffusion layer 15 may be removed entirely after the doping step that forms heaving doped contact regions 22. Next (referring to FIG. 4c), before the doping step to form heavily doped junction region 14, dielectric layer 28 can be formed on first surface 10, then patterned to expose only desired portions of first surface 10, while covering heavily doped contact regions 22 just formed. Dielectric layer 28 can then serve as a diffusion barrier during the diffusion doping step to dope heavily doped junction region or regions 14 at the exposed areas of first surface 10. The hydrogen/helium implant step is performed next, followed by formation of conductive layer 12 and bonding to receiver element 60. Many other variations are possible; clearly it is impractical to list all possible ways to form this or an equivalent structure.

Figure 4E:
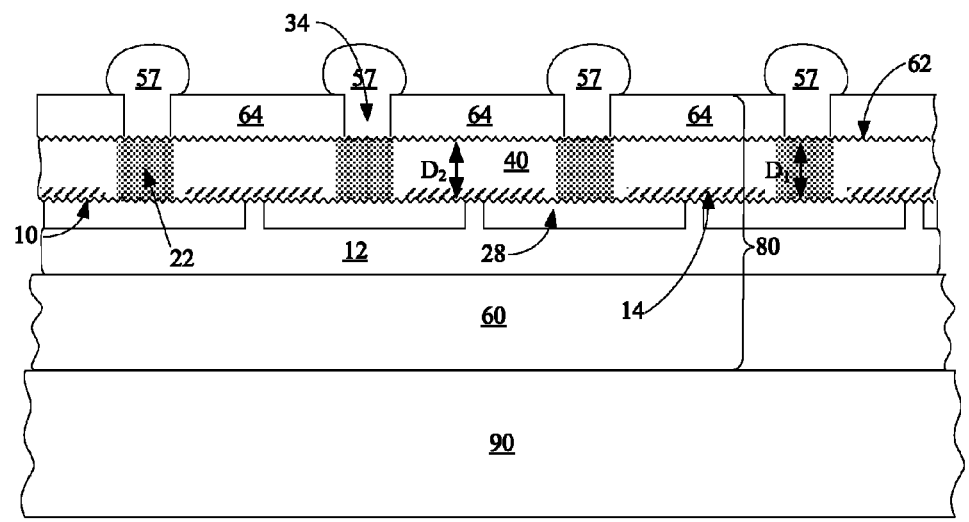

The completed structure is shown in FIG. 4e. A photovoltaic assembly 80 includes lamina 40 and receiver element 60, and includes at least one photovoltaic cell. During normal operation, incident light enters the photovoltaic cell through silicon nitride layer 64 at second surface 62, travels through lamina 40, and is reflected from conductive layer 12, at the back of the photovoltaic assembly, back into lamina 40 at first surface 10. A plurality of photovoltaic assemblies 80 can be affixed to a substrate 90, which serves as a support element. Each photovoltaic cell will typically be electrically connected in series to another photovoltaic cell, forming a photovoltaic module. In alternative embodiments, a plurality of photovoltaic assemblies 80 may instead be affixed to a transparent superstrate (not shown) serving as a support element.

Note that in the present example both the base of the photovoltaic cell (the lightly doped portion of lamina 40) and the emitter (heavily doped junction region 14), are within lamina 40.

EXAMPLE

Receiver Element as Superstrate

In the example just described, and shown in FIG. 4e, receiver element 60 serves as a substrate in the completed photovoltaic assembly 80. In other embodiments, a receiver element 66 may serve instead as a superstrate.

Figure 5A:
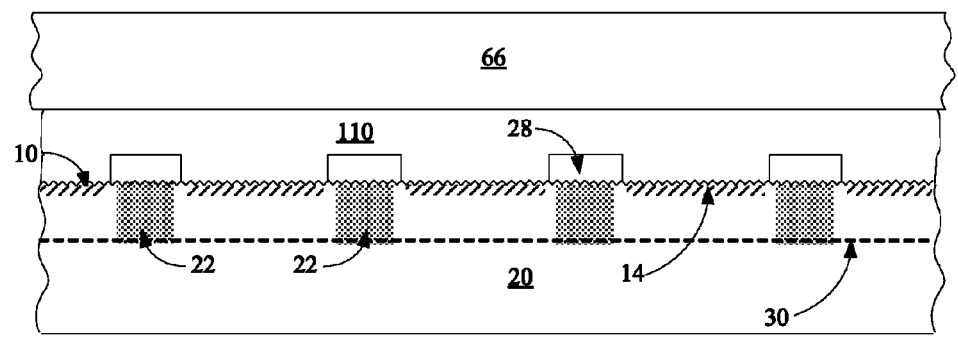
FIGS. 5a-5d are cross-sectional views illustrating stages in formation of a photovoltaic cell according to another embodiment of the present invention in which a receiver element serves as a superstrate in the completed cell.

Referring to FIG. 5a, fabrication begins as in the prior example. Donor wafer 20 may be a lightly doped n-type silicon wafer. As described, two diffusion doping steps are performed at first surface 10 to form heavily doped contact regions 22 and heavily doped junction region 14. In this example heavily doped contact regions 22 are doped with an n-type dopant, while heavily doped contact region 14 is doped with a p-type dopant. After diffusion doping, gas ions, for example hydrogen and/or helium, are implanted through first surface 10 to form cleave plane 30.

Dielectric layer 28, which may be an oxide or nitride, for example silicon nitride, is formed on first surface 10. Openings are formed in dielectric layer 28, exposing some portion of heavily doped junction region 14. It may be advantageous remove nearly all of dielectric layer 28, leaving it covering only heavily doped contact regions 22.

Next a transparent conductive oxide (TCO) 110 is formed on what remains of dielectric layer 28, contacting exposed portions of heavily doped junction region 14 at first surface 10. This TCO 110 may be any appropriate material, for example aluminum doped zinc oxide, indium tin oxide, tin oxide, titanium oxide, etc. This layer will also serve as an ARC. Layer 110 may have any appropriate thickness, for example between 600 and 2000 angstroms, for example between 800 and 1500 angstroms, and in some embodiments about 1000 angstroms.

Figure 5B:
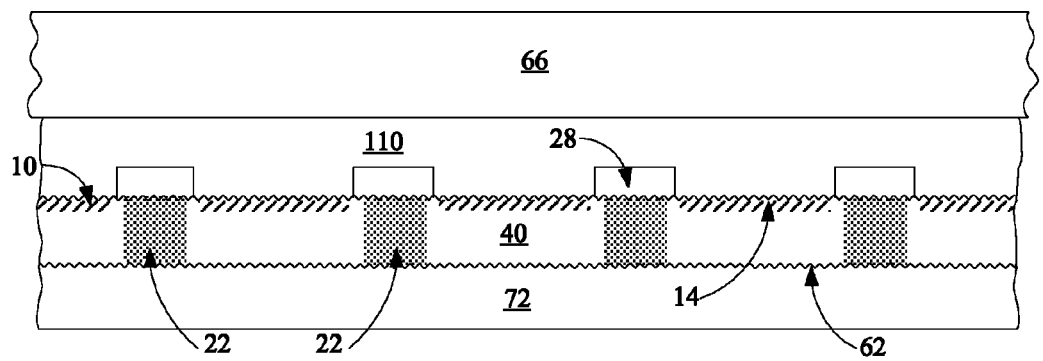

Next donor wafer 20 is affixed to receiver element 66 at first surface 10, with TCO layer 110 interposed between them, along with the remaining portion of dielectric layer 28. Receiver element 66 is a transparent or near-transparent material such as glass, including borosilicate glass, or a polymer. The structure is bonded using any of the methods described earlier. In some embodiments, a second transparent layer, such as silicon dioxide deposited by plasma-enhanced chemical vapor deposition, may be deposited on top of the TCO to aid in bonding. As shown in FIG. 5b, a thermal step causes lamina 40 to cleave from donor wafer 20 at the cleave plane, creating second surface 62.

As in the prior example, some treatment, including etching, cleaning, plasma treatment, or anneal is performed at second surface 62. Heavily doped contact regions 22 may or may not have been exposed at second surface 62 immediately after cleaving. Heavily doped contact regions 22 will be exposed at second surface 62 after this surface has been treated.

Next electrical contact is formed to heavily doped contact regions 22. This electrical contact can be achieved by forming a layer 72 of a reflective, conductive material on second surface 62. Layer 72 may be, for example, silver, aluminum, titanium, or any other suitable material.

Figure 5C:
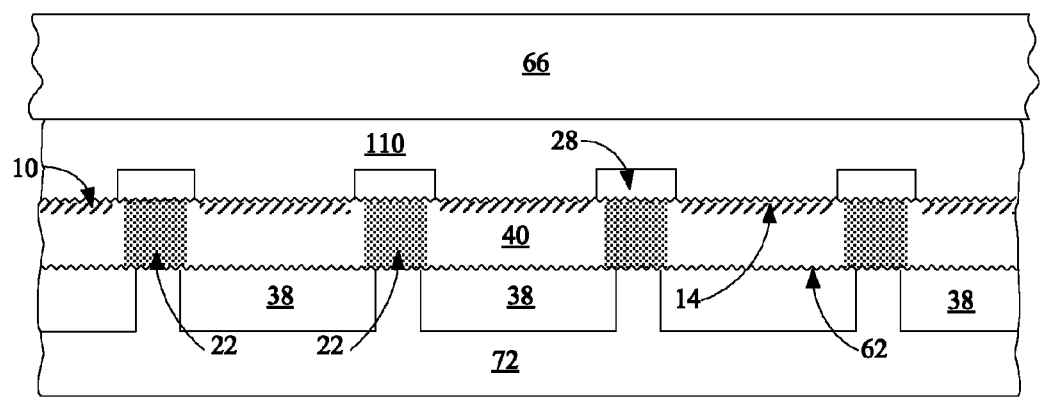

Alternatively, as shown in FIG. 5c, a dielectric layer 38, such as silicon nitride or silicon dioxide, may be deposited on second surface 62. Openings, which may be holes or trenches, are opened in dielectric layer 38 by any appropriate method, exposing at least portions of heavily doped contact regions 22 at second surface 62. Layer 72 of a reflective, conductive material is formed on dielectric layer 38, making electrical contact to heavily doped contact regions 22.

Figure 5D:
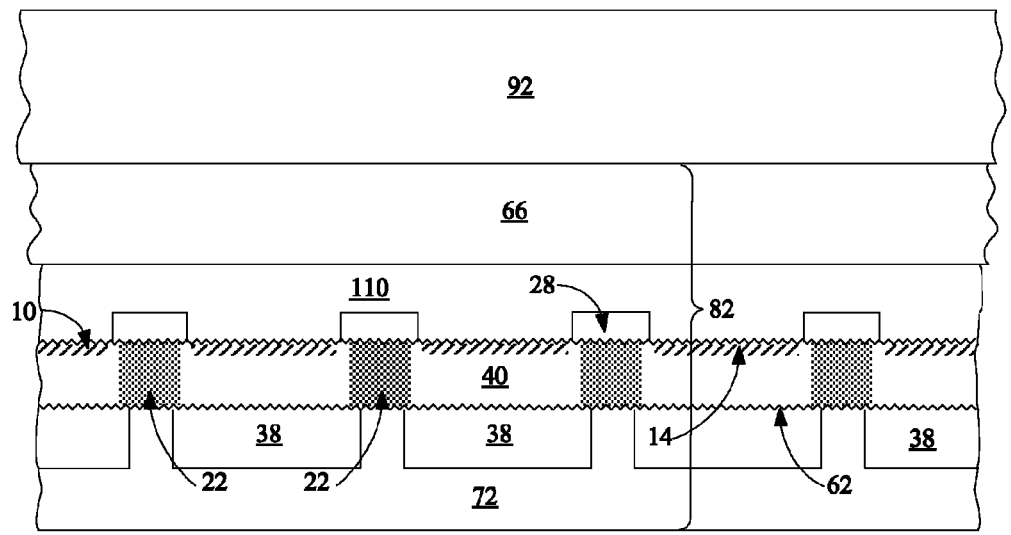

The completed photovoltaic assembly 82, shown in FIG. 5d, includes lamina 40 and receiver element 66, and comprises at least one photovoltaic cell. A plurality of photovoltaic assemblies can be formed and can be affixed to a transparent superstrate 92, or, alternatively, to a substrate (not shown), forming a photovoltaic module. The photovoltaic cells within such a photovoltaic module are typically electrically connected in series.

As in the prior example, first surface 10 is at the side of lamina 40 bonded to the receiver element, while second surface 62 was created by cleaving. In contrast with the prior embodiment, however, in normal operation, incident light enters lamina 40 at light-facing first surface 10 and travels toward second surface 62 at the back of the photovoltaic cell. The base region of this photovoltaic cell is the lightly doped body of lamina 40, while the emitter is heavily doped junction region 14.

In the embodiments shown in both FIGS. 4e and 5d, the p/n junction is formed between heavily doped junction region 14 and the body of lightly doped lamina 40. In the embodiment shown in FIG. 4e, this junction is typically formed nearer the back of the photovoltaic cell, while in the embodiment shown in FIG. 5d, this junction is typically formed nearer the front of the photovoltaic cell.

EXAMPLE

Doping in a Single Thermal Step

In the detailed examples provided so far, heavily doped contact regions and heavily doped junction region, both formed at the surface of the donor body, are formed in separate thermal steps. In alternative embodiments, these regions may be doped, or the dopant activated, in the same thermal step or steps.

Figure 6A:
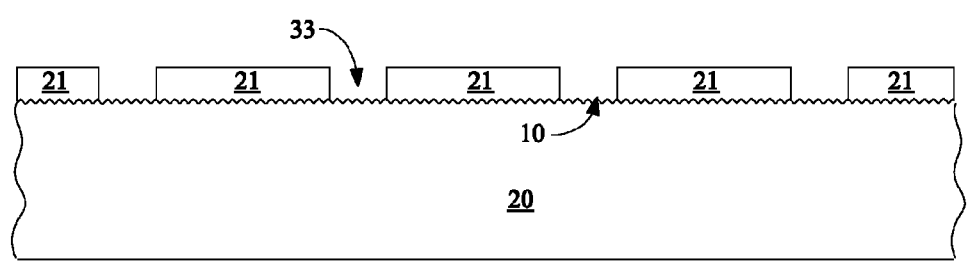
FIGS. 6a-6d are cross-sectional views illustrating stages in formation of a photovoltaic cell according to still another embodiment of the present invention in which doped regions of opposite conductivity type are doped in a single thermal step.

Referring to FIG. 6a, layer 21 of a doped oxide, for example BSG, a boron-doped glass, is formed on first surface 10 of lightly doped n-type donor wafer 20. This BSG layer 21 can be deposited, for example, by atmospheric pressure chemical vapor deposition, or be formed by any appropriate method. Openings 33 are formed, for example by screen-printed etchant paste, masking and etching or laser ablation, in BSG layer 21. Openings 33 may be trenches or holes.

Figure 6B:
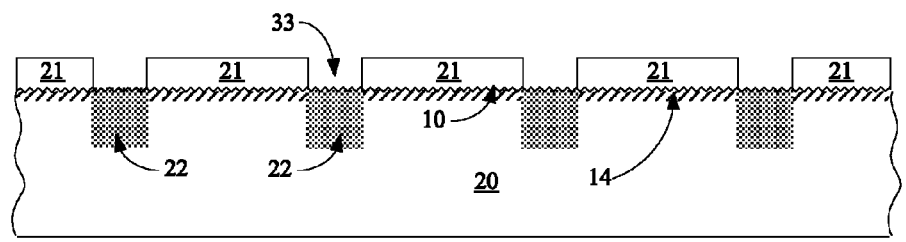
Figure 6C:
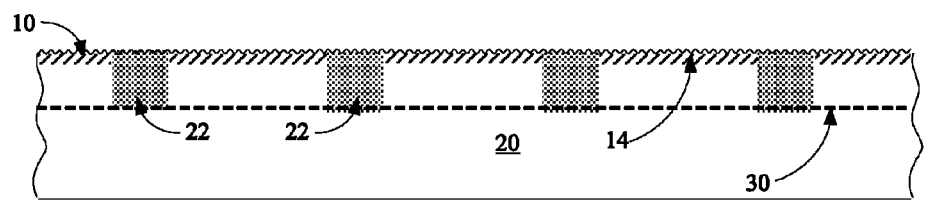

Turning to FIG. 6b, heavily doped contact regions 22 are formed by diffusion doping in the regions of first surface 10 that are exposed in openings 33. In this example, these regions will be heavily doped with an n-type dopant such as phosphorus. Diffusion doping is typically performed at relatively high temperature; thus during this diffusion doping step, boron from BSG layer 21 is driven into adjacent portions of donor wafer 20, forming heavily doped junction region 14, which is p-doped. The diffusivity of phosphorus is greater than the diffusivity of boron under typical conditions, so n-doped regions 22 will diffuse to a greater depth than p-doped regions 14. Turning to FIG. 6c, an etch removes BSG layer 21, along with phosphosilicate glass regions (not shown) formed during diffusion doping where heavily doped contact regions 22 meet first surface 10. As in the prior embodiments, gas ions are implanted to form cleave plane 30. Fabrication continues as described earlier to complete a photovoltaic cell.

The embodiments so far described result in a photovoltaic cell having a lightly doped n-type base region and a heavily doped p-type emitter region. It will be understood that in any embodiment, these dopant types may be reversed.

For example, referring to FIG. 6b, a photovoltaic cell may be formed having a lightly p-doped base region, p-type heavily doped contact regions 22, and an n-type heavily doped junction region 14. In this case, in one embodiment donor wafer 20 may be a lightly doped p-type wafer, and layer 21 may be arsenic-doped glass. As described earlier, openings 33 are formed in arsenic-doped glass layer 21. A diffusion doping step with a p-type dopant such as boron forms p-type heavily doped contact regions 22. The elevated temperature during this diffusion doping step drives arsenic, an n-type dopant, from arsenic-doped glass layer 21 into donor wafer 20, forming n-type heavily doped junction region 14. Arsenic diffuses more slowly than phosphorus, allowing a shallower junction to be formed. This maximizes the thickness of the base region in the completed cell, which may improve conversion efficiency.

Figure 6D:
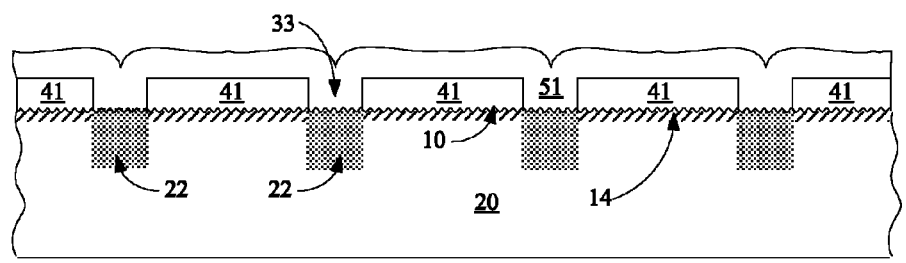

As with other structures described herein, alternate methods of fabrication are possible. For example, referring to FIG. 6d, in an alternative embodiment a first layer 41 of arsenic-doped glass is formed on first surface 10. Openings 33 are formed in arsenic-doped glass layer 41 by any appropriate method, and a layer 51 of BSG is formed on arsenic-doped glass layer 41, contacting first surface 10 in openings 33. A single anneal drives dopant from both doped glass layers into wafer 20, forming p-type heavily doped contact regions 22 and n-type heavily doped junction region 14. The slow diffusion rate of arsenic assures that heavily doped junction region 14 is significantly shallower than heavily doped contact regions 22.

Any of the fabrication methods described herein can be combined, and further can be combined with any of the fabrication methods described in Sivaram et al. or in any of the other incorporated applications. A variety of embodiments has been provided for clarity and completeness. Clearly it is impractical to list all embodiments. Other embodiments of the invention will be apparent to one of ordinary skill in the art when informed by the present specification.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A photovoltaic cell comprising:
   a semiconductor lamina lightly doped to a first conductivity type, the lamina having a first surface and a second surface opposite the first surface and a thickness of the lamina between the first surface and the second surface is between about 0.2 microns and about 10 microns,
   wherein the lamina includes a plurality of discrete heavily doped contact regions, wherein each heavily doped contact region is doped to the first conductivity type and above a first dopant concentration, and extends contiguously through the lamina from the first surface to the second surface,
   wherein the lamina comprises at least a portion of a base of the photovoltaic cell,
   wherein the lamina further comprises a heavily doped junction region doped to a second conductivity type opposite the first, wherein the heavily doped junction region is at the first surface and only the first surface, and
   wherein a first electrical contact is positioned on the first surface and electrically connected to the heavily doped junction region doped to a second conductivity type and a second electrical contact is positioned on the second surface and electrically connected to the heavily doped contact regions doped to a first conductivity type.

2. The photovoltaic cell of claim 1 wherein the first dopant concentration is at least about $3 \times 10^{18}$ atoms/cm$^3$.

3. The photovoltaic cell of claim 1 wherein the first dopant concentration is at least about $1 \times 10^{19}$ atoms/cm$^3$.

4. The photovoltaic cell of claim 1 wherein the lightly doped semiconductor lamina is doped to a dopant concentration less than about $1 \times 10^{18}$ atoms/cm$^3$.

5. The photovoltaic cell of claim 1 wherein the heavily doped junction region is electrically isolated from the heavily doped contact regions.

6. The photovoltaic cell of claim 1 wherein the first conductivity type is p-type and the heavily doped junction region is doped with arsenic.

7. The photovoltaic cell of claim 1 wherein the first conductivity type is p-type and the heavily doped junction region is doped with phosphorus.

8. The photovoltaic cell of claim 1 wherein the first conductivity type is n-type and the heavily doped junction region is doped with boron.

9. The photovoltaic cell of claim 1 wherein the thickness of the lamina between the first surface and the second surface is between about 0.5 microns and about 6 microns.

10. The photovoltaic cell of claim 1 wherein the semiconductor lamina is formed of fully crystalline silicon having an average grain size of at least 1000 angstroms.

11. The photovoltaic cell of claim 1 wherein the semiconductor lamina is monocrystalline silicon.

12. The photovoltaic cell of claim 1 wherein, at the first surface, the heavily doped contact regions are stripes having a width no more than about 120 microns.

13. The photovoltaic cell of claim 1 wherein, at the first surface, the heavily doped contact regions are isolated spots, each having a longest surface dimension no more than about 120 microns.

14. The photovoltaic cell of claim 1 wherein the lamina is bonded at the first surface to a receiver element, the receiver element having a widest dimension no more than about twenty percent greater than the widest dimension of the lamina.

15. The photovoltaic cell of claim 14 wherein the widest dimension of the receiver element is no more than about 30 cm.

16. The photovoltaic cell of claim 14 wherein one or more layers intervene between the lamina and the receiver element.

17. The photovoltaic cell of claim 14 wherein the receiver element is a substrate during normal operation of the photovoltaic cell.

18. The photovoltaic cell of claim 14 wherein the receiver element is a superstrate during normal operation of the photovoltaic cell.

19. The photovoltaic cell of claim 14 wherein a photovoltaic assembly comprises the lamina, the photovoltaic cell, and the receiver element, wherein the photovoltaic assembly is one of a plurality of photovoltaic assemblies, wherein each photovoltaic assembly is affixed to a support element, forming a photovoltaic module, and wherein the photovoltaic cells of the plurality of photovoltaic assemblies are electrically connected in series.

* * * * *